United States Patent
Wendt (10) Patent No.: US 8,140,292 B2
(45) Date of Patent: Mar. 20, 2012

(54) METHOD AND SYSTEM FOR CONTROLLING A VOLTAGE WAVEFORM

(75) Inventor: Amy Wendt, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 1218 days.

(21) Appl. No.: 11/857,202

(22) Filed: Sep. 18, 2007

(65) Prior Publication Data

US 2009/0077150 A1    Mar. 19, 2009

(51) Int. Cl.
*G06F 19/00* (2011.01)
(52) U.S. Cl. ....... 702/124; 73/865.9; 327/105; 702/189; 708/105; 708/270
(58) Field of Classification Search .......... 73/1.01, 73/432.1, 865.8, 865.9; 327/100, 105; 702/1, 702/85, 108, 109, 124, 127, 187, 189; 708/100, 708/105, 160, 200, 270, 271
See application file for complete search history.

(56) References Cited

U.S. PATENT DOCUMENTS

| | | | | |
|---|---|---|---|---|
| 3,082,374 A | * | 3/1963 | Buuck | 324/73.1 |
| 3,097,339 A | * | 7/1963 | McAuliffe | 327/129 |
| 3,237,100 A | * | 2/1966 | Chalfin et al. | 324/108 |
| 3,345,864 A | * | 10/1967 | Painter et al. | 73/659 |
| 3,420,098 A | * | 1/1969 | Painter et al. | 73/659 |
| 4,539,518 A | * | 9/1985 | Kitayoshi | 324/76.21 |
| 5,051,916 A | * | 9/1991 | Benson | 702/76 |
| 6,201,208 B1 | | 3/2001 | Wendt et al. | |

FOREIGN PATENT DOCUMENTS

FR    2702911 A1 * 9/1994

OTHER PUBLICATIONS

Patterson, et al., "Arbitrary substrate voltage wave forms for manipulating energy distribution of bombarding ions during plasma processing," Plasma Sources Sci. Technol., vol. 16, pp. 257-264 (2007).
Wendt, et al., "Automated substrate voltage waveform creation to control energy distribution of bombarding ions during plasma processing," 2006 GEC, Columbus, OH, Oct. 10-13, 2006.
Wang, et al., "Ion bombardment energy and $SiO_2|Si$ fluorocarbon plasma etch selectivity," J. Vac. Sci. Technol. A 19(5), p. 2425, Sep./Oct. 2001.
Silapunt et al., "Ion bombardment energy control for selective fluorocarbon plasma etching of organosilicate glass," J. Vac. Sci. Technol. B22(2), p. 826, Mar./Apr. 2004.

* cited by examiner

*Primary Examiner* — Edward Cosimano
(74) *Attorney, Agent, or Firm* — Bell & Manning, LLC (57) ABSTRACT

A method of automating a process for controlling a voltage waveform applied to an object is provided. A first waveform for applying to the object is received. A first FFT of the first waveform is calculated. A second waveform for input to the waveform generator is determined based on the first waveform. The determined second waveform is sent to a waveform generator. A third waveform is received that is measured across the object based on a waveform generated by the waveform generator. A second FFT of the received third waveform is calculated. The third waveform is compared with the first waveform to determine a convergence status of the third waveform. If the determined convergence status is not converged, an updated waveform is calculated based on the first FFT and the second FFT and the process is repeated with the updated waveform as the determined second waveform.

23 Claims, 9 Drawing Sheets

METHOD AND SYSTEM FOR CONTROLLING A VOLTAGE WAVEFORM

REFERENCE TO GOVERNMENT RIGHTS

This invention was made with United States government support awarded by the following agencies: National Science Foundation, Electrical & Communications System Div., Award No. 0078522. The United States government has certain rights in this invention.

FIELD

The field of the disclosure relates generally to controlling a voltage waveform applied to an object. More specifically, the disclosure relates to controlling a substrate voltage waveform to control an ion energy distribution in a plasma processing for integrated circuit fabrication.

BACKGROUND

Substrate bombardment by energetic ions is a central element of plasma etching used in fabrication of integrated circuits (IC), as well as plasma processes for thin film deposition and surface modification. A primary feature of plasma etching is etch directionality resulting from positive ions bombarding the substrate at normal incidence. For commercial IC fabrication, high etch rates, etch anisotropy, high etch selectivity between materials and low damage must be achieved simultaneously, and all are sensitive to ion bombardment energy, in addition to ion flux, gas phase chemical composition, substrate temperature, and other factors. Reduction of device dimensions and the use of new materials associated with continuing advancement in IC performance further constrains etch processes.

High etch selectivity, in which the etch rate of one material is much higher than that of others, is a necessary characteristic for many etch processes in integrated circuit (IC) manufacturing. Highly selective etching can prevent excessive erosion of photoresist and/or underlying films, thereby permitting overetching to compensate for across wafer etch non-uniformities. For example, as part of the "damascene" process, plasma etching is used to etch trenches and vias in inter layer dielectric (ILD) layers, which are then filled with metal to form the interconnects between transistors and other IC components. In order to precisely control the depth of these trenches, thin etch stop layers (ESLS) of a different dielectric material may be introduced at the desired depth. The success of this approach depends on a plasma etch process with sufficiently high etch selectivity over the ESL material.

In addition to selectivity, substrate damage induced by bombardment by high energy ions is another consideration in etching processes. As IC feature sizes continue to shrink, the thickness of the gate oxide is expected to decrease to only a few tens of angstroms in the near future. As a result, the gate oxide becomes more vulnerable to high energy ion bombardment and cannot tolerate any thinning during overetch. Further, when the line width of photoresist becomes thinner, it becomes less resistant to erosion by sputtering. Therefore, more precise control of ion bombardment energy at the substrate may play a key role in future IC fabrication, especially for processes with poor selectivity.

A third area sensitive to ion bombardment energy is the control of the profile of high aspect ratio features etched into the substrate using a plasma process. Local charging of feature sidewalls by electrons during the etching process may affect the shape of the feature as it develops by causing deflection of the trajectories of bombarding ions. In the etching of high aspect ratio trenches, for example, a combination of both low and high energy ions may be desirable, as the low energy ions entering the trenches may be easily deflected to neutralize negative charge on the trench sidewalls due to incident plasma electrons, minimizing deflection of higher energy ions which can then reach the trench bottom to enhance etching there.

In general, there are two possible components to any approach to increasing etch selectivity, chemical and physical. The chemical component involves making use of the influence of chemically different ion and neutral species in the plasma, by changing the gas mixture or operating conditions to improve selectivity. Etching of silicon and silicon dioxide in high density plasma process tools, for example, has shown higher SiO2/Si selectivity for feed gases with high carbon to fluorine atom ratios, such as C2F6 and C4F8 or by the addition of H2. Alternatively, radical densities in plasmas may be indirectly controlled by adjusting the chamber wall temperature or injecting radical species. In all of these cases, the selectivity of $SiO_2$/Si is based on the selective deposition of fluorocarbon films on silicon.

The physical component involves controlling the bombardment of the substrate by energetic ions. If most ions bombarding the substrate strike with energy above the etch threshold for $SiO_2$, or any other material of interest, and below those of the other materials, the etch selectivity will be infinite. In typical plasma processes used to manufacture ICs, the ion energy is coarsely controlled by varying the amplitude of a radio frequency (RF) sinusoidal bias voltage that is applied to the substrate electrode. However, the resulting ion energy distribution function (IEDF) is generally broad, which limits the ability of the plasma process to further improve etch selectivity. By replacing the standard sinusoidal waveform with a waveform that produces an appropriate energy distribution of bombarding ions, greater etch selectivity can be achieved.

Thus, accurate and reproducible control of ion bombardment energy is desirable to control process outcomes. IED control can be achieved by tailoring the waveform shape of the RF bias voltage applied to the substrate during processing using a programmable waveform generator in combination with a power amplifier. Initial studies of bombarding ion energy control involved a manual trial and error method of setting the voltage waveform on the substrate by adjusting the voltage waveform output of the signal generator. One cycle of the generator output was programmed point by point (about 85 points per cycle) and modified until the desired substrate waveform was achieved. This approach limits control of electrode waveform shape as well as the ability to create more complex shapes, because the process is unpredictable and therefore lengthy and tedious. Additionally, due to the frequency dependence of the amplifier gain and the impedance of the plasma in contact with the substrate as well as other system nonlinearities, it is not practical to try to predict the shape of the waveform needed at the waveform generator output to produce a target waveform voltage at the substrate. Thus, a method and a system for automatically producing a target waveform at the substrate is needed.

SUMMARY

A method, device, computer readable medium, and system for automatically producing a target waveform at the substrate is provided in an exemplary embodiment. A fast Fourier transform (FFT) of a measured substrate waveform is compared with the FFT of a desired waveform to determine adjustments for frequency components of the waveform input to a waveform generator. An inverse FFT yields the output waveform for application to the waveform generator. The process is repeated until the measured substrate waveform converges to the targeted waveform characteristics.

In another exemplary embodiment, a method is provided to automate a process for controlling a voltage waveform applied to an object. A first waveform for applying to the object is received. A first FFT of the first waveform is calculated. A second waveform for input to the waveform generator is determined based on the first waveform. The determined second waveform is sent to a waveform generator. A third waveform is received that is measured across the object based on a waveform generated by the waveform generator. A second FFT of the received third waveform is calculated. The third waveform is compared with the first waveform to determine a convergence status of the third waveform. If the determined convergence status is not converged, an updated waveform is calculated based on the first FFT and the second FFT and the process is repeated with the updated waveform as the determined second waveform.

In yet another exemplary embodiment, a computer-readable medium is provided. The computer-readable medium has computer-readable instructions therein that, upon execution by a processor, cause the processor to implement the operations of the method of automating a process for controlling a voltage waveform applied to an object.

In an exemplary embodiment, a device is provided for setting a voltage waveform at a platform supporting a substrate for etching using a plasma etching process. The device includes, but is not limited to, a waveform generator, a processor, and a computer-readable medium operably coupled to the processor. The computer-readable medium includes instructions that, upon execution by the processor, perform operations which cause the device to implement the operations of the method of automating a process for controlling a voltage waveform applied to an object.

In an exemplary embodiment, a system is provided for performing a plasma etching process. The system includes, but is not limited to, a plasma reactor and a signal generator. The plasma reactor includes, but is not limited to, a platform for supporting a substrate to be etched, a chamber enclosing the platform, and a plasma excitation source coupled to the chamber for exciting a plasma and forming a gas in the chamber. The signal generator includes, but is not limited to, a waveform generator, a processor, and a computer-readable medium operably coupled to the processor. The computer-readable medium includes instructions that, upon execution by the processor, perform operations which cause the device to implement the operations of the method of automating a process for controlling a voltage waveform applied to the substrate.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings, wherein like numerals denote like elements.

DETAILED DESCRIPTION

Figure 1:
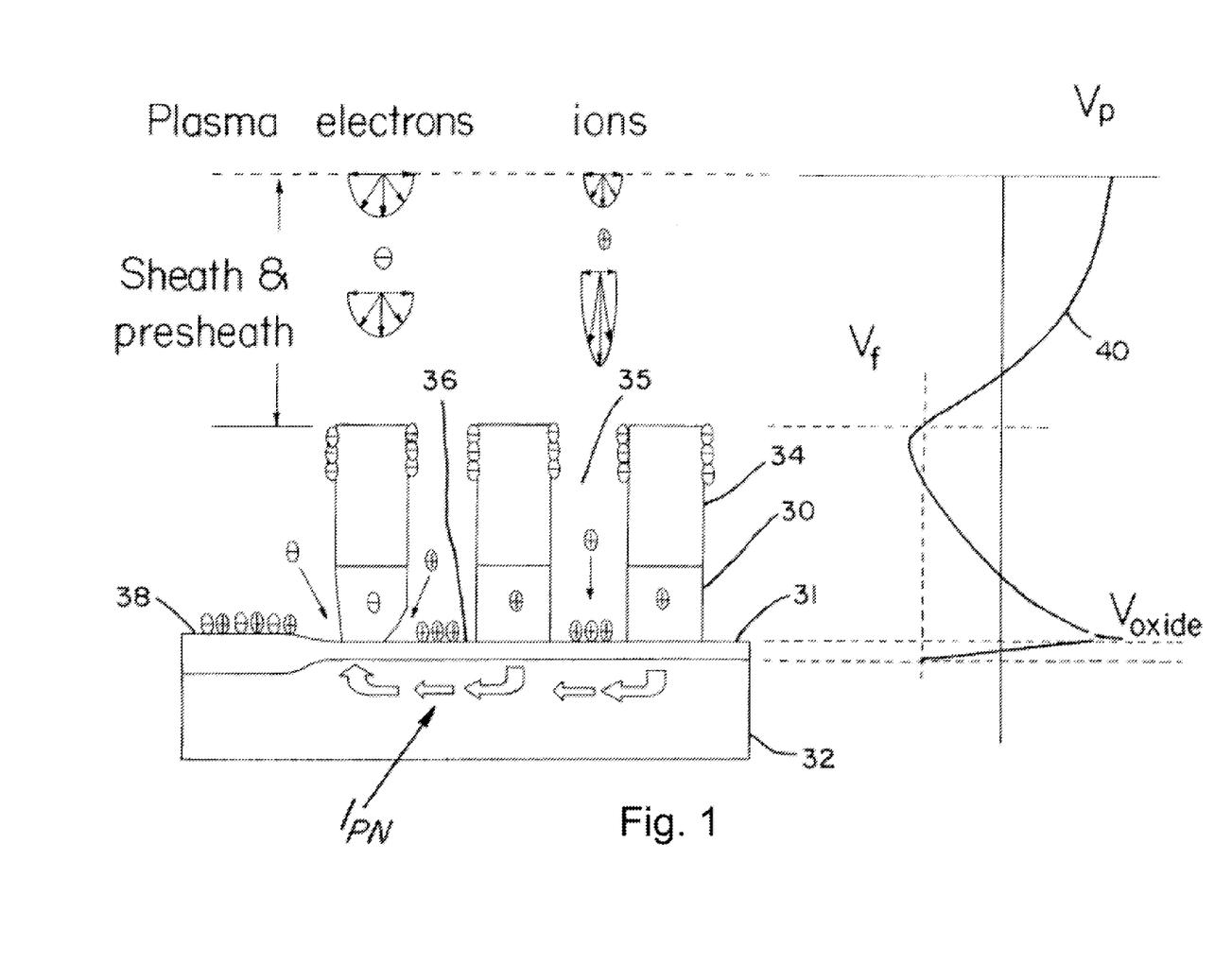
FIG. 1 is a schematic view illustrating a collection of charge on structures during conventional reactive ion etching processes and the potential notching and tunneling current damage due to differential charging.

With reference to FIG. 1, the causes and effects of differential charging that occur during conventional plasma etching are illustrated. For purposes of illustration, a substrate or workpiece is shown in FIG. 1 comprised of a thin layer of polysilicon film 30 applied over a gate layer of silicon dioxide 31 on a single crystal silicon wafer 32. The polysilicon film 30 is covered by a layer of photoresist 34 which is patterned in a conventional manner to form trenches 35 which, during the initial etching process, are etched through the polysilicon film 30 to expose surfaces 36 of the silicon dioxide layer 31. The electrons are indicated by the circles with a "−" sign in them, while the ions are indicated by the circles with a "+" sign in them. The electrostatic forces on the ions and electrons are schematically illustrated for the main plasma region and for the plasma sheath and pre-sheath.

The electrons arrive at the surfaces of the photoresist 34 and the polysilicon film 30 with nearly an isotropic distribution, permitting a large fraction of them to strike the upper sidewalls of the photoresist 34. More electrons accumulate on the sidewalls of the resist than ions, charging the sidewalls negatively. The ions reach the surfaces of the photoresist 34 and the polysilicon film 30 almost completely normal to these surfaces because of the accelerating potential drop $V_f$ across the sheath. As a result, a large flux of ions is directed to the exposed surfaces 36 (including the exposed polysilicon film 30 before it has been etched away to the point illustrated in FIG. 1). The exposed surfaces 36 become positively charged.

The materials of the photoresist 34 (as well as many of the etchable film materials such as undoped polysilicon or silicon dioxide) are dielectrics, so that the differential charging of these structures is substantially maintained. The differential charging builds an electric field strong enough to distort the trajectory of the ions and electrons. Ions are deflected toward the sidewalls and strike and etch away these walls. The ions can be sufficiently deflected to etch into the bottom of the vertical structures, particularly the outermost of a series of line type structures to form a notch as illustrated in FIG. 1. A field oxide 38 also may be formed on the substrate. The charging $V_{oxide}$ of the silicon dioxide layer 31 can drive tunneling currents $I_{pn}$ that damage the thin silicon dioxide layer 31.

The potential $V_p$ at the various regions is illustrated by the graph labeled 40 in FIG. 1. As illustrated therein, the potential $V_p$ is substantially different at the top surface of the photoresist 34 than at the exposed surfaces 36 of the trenches 35. The ion trajectory (or ion energy) is strongly related to the etching profile. Undesired effects that can result from lack of control over the etching profile include a bowed trench, a double trenched bottom, a wide trench, a narrow trench, etc.

In conventional plasma etching processes, a pulsed, RF bias voltage is applied through a matching network to the platform electrode on which the substrate (workpiece) is mounted so that a DC self-bias is developed on the support platform and on the substrate. Control of the energy distribution of ions bombarding the substrate during plasma etching has demonstrated beneficial effects on etch selectivity for integrated circuit fabrication. Ion energy distribution control can be achieved by tailoring the waveform shape of the RF bias voltage applied to the substrate during processing. Accurate and reproducible control of the ion bombardment energy provides a better understanding of the nature of the plasma-surface interaction to control process outcomes.

Figure 2:
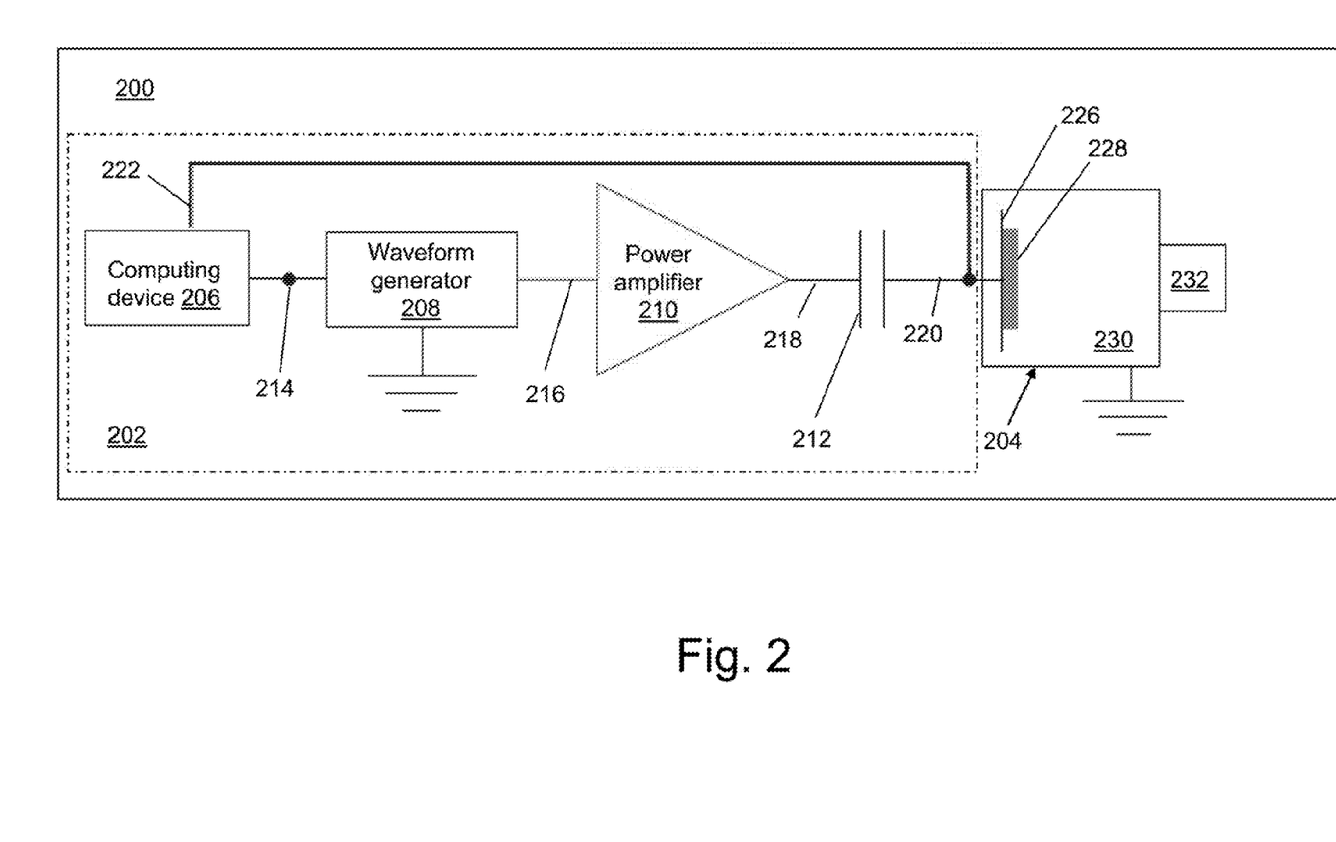
FIG. 2 depicts a schematic diagram of a plasma processing system including a signal generator used to produce an electrode waveform in accordance with an exemplary embodiment.

With reference to FIG. 2, a plasma processing system 200 is shown in accordance with an exemplary embodiment. Plasma processing system 200 may include a signal generator 202 and a plasma reactor 204. Different and additional components may be incorporated into plasma processing system 200. Signal generator 202 may include a computing device 206, a waveform generator 208, a power amplifier 210, and a blocking capacitor 212. Waveform generator 208, power amplifier 210, computing device 206, and/or blocking capacitor 212 may be integrated into one or more devices. Computing device 206 may connect to waveform generator 208 using a cable or using a network. Computing device 206 may be a computer of any form factor.

Computing device 206 outputs a first signal on a first line 214 to waveform generator 208. Waveform generator 208 outputs a second signal on a second line 216 to power amplifier 210. Power amplifier 210 outputs a third signal on a third line 218 to blocking capacitor 212. Blocking capacitor 212 is electrically connected to a support platform 226 of plasma reactor 204 by a fourth line 220, which provides the bias voltage to support platform 226. A substrate 228 to be treated (e.g., a semiconductor wafer), is supported on support platform 226, which may comprise a portion of a conventional wafer chuck for semiconductor wafer processing. Support platform 226 may be conductive such that substrate 228 is at the same potential as platform 226. Support platform 226 also may be formed to include an insulating layer such that substrate 228 is capacitively coupled to platform 226, but may float at a different voltage than platform 226. A fifth line 222 provides a feedback path of the bias voltage provided to support platform 226 to computing device 206.

Blocking capacitor 212 permits a DC self bias to be developed at substrate 228 as the bias drive voltage is coupled through the capacitor to the substrate. The voltage provided to support platform 226 results in a flow of electrons to substrate 228. In an exemplary embodiment, the bias voltage waveform is non-sinusoidal. Thus, the bias voltage waveform does not contain a single frequency component, but can be represented as a superposition of sinusoidal Fourier components at multiple, different frequencies. Because of the multiple frequencies involved, conventional impedance matching by tuning of the matching network is generally not appropriate. Thus, use of blocking capacitor 212 to couple the bias power to platform 226 rather than a conventional matching network facilitates application of the desired bias waveform to platform 226 and to substrate 228.

Figure 3:
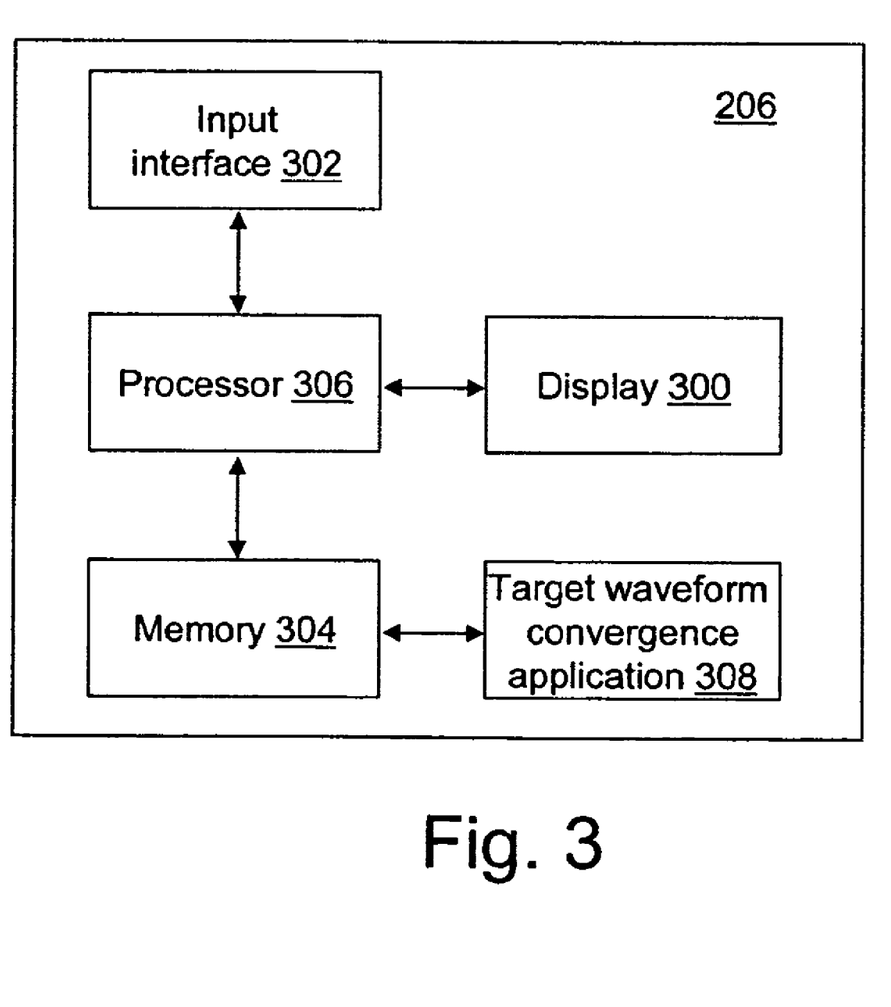
FIG. 3 is a component diagram of a computing device of the signal generator of FIG. 2 in accordance with an exemplary embodiment.

With reference to FIG. 3, computing device 206 is shown in accordance with an exemplary embodiment. Computing device 206 may include a display 300, an input interface 302, a memory 304, a processor 306, and an target waveform convergence application 308. Display 300 presents information to a user of computing device 206 as known to those skilled in the art. For example, display 300 may be a thin film transistor display, a light emitting diode display, a liquid crystal display, or any of a variety of different displays known to those skilled in the art now or in the future.

Input interface 302 provides an interface for receiving information from the user for entry into computing device 206 as known to those skilled in the art. Input interface 302 may use various input technologies including, but not limited to, a keyboard, a pen and touch screen, a mouse, a track ball, a touch screen, a keypad, one or more buttons, etc. to allow the user to enter information into computing device 206 or to make selections presented in a user interface displayed on display 300. Input interface 302 may provide both an input and an output interface. For example, a touch screen both allows user input and presents output to the user.

Memory 304 is an electronic holding place or storage for information so that the information can be accessed by processor 306 as known to those skilled in the art. Computing device 206 may have one or more memories that use the same or a different memory technology. Memory technologies include, but are not limited to, any type of RAM, any type of ROM, any type of flash memory, etc. Computing device 206 also may have one or more drives that support the loading of a memory media such as a compact disk or digital video disk.

Processor 306 executes instructions as known to those skilled in the art. The instructions may be carried out by a special purpose computer, logic circuits, or hardware circuits. Thus, processor 306 may be implemented in hardware, firmware, software, or any combination of these methods. The term "execution" is the process of running an application or the carrying out of the operation called for by an instruction. The instructions may be written using one or more programming language, scripting language, assembly language, etc. Processor 306 executes an instruction, meaning that it performs the operations called for by that instruction. Processor 306 operably couples with display 300, with input interface 302, and with memory 304 to receive, to send, and to process information. Processor 306 may retrieve a set of instructions from a permanent memory device and copy the instructions in an executable form to a temporary memory device that is generally some form of RAM. Computing device 206 may include a plurality of processors that use the same or a different processing technology.

Target waveform convergence application 308 performs operations associated with automating the process of setting a target voltage waveform applied to an object such as support platform 226. Some or all of the operations and interfaces subsequently described or displayed graphically may be embodied in target waveform convergence application 308. The operations may be implemented using hardware, firmware, software, or any combination of these methods. With reference to the exemplary embodiment of FIG. 3, target waveform convergence application 308 is implemented in software stored in memory 304 and accessible by processor 306 for execution of the instructions that embody the operations of target waveform convergence application 308. Target waveform convergence application 308 may be written using one or more programming languages, assembly languages, scripting languages, etc.

Plasma reactor 204 may be of substantially conventional construction, including a vacuum chamber 230 which is evacuated by a pump or pumps (not shown). In an exemplary embodiment, vacuum chamber 230 is grounded. The plasma excitation in plasma reactor 204 is by a plasma excitation source 232. For exemplification only, plasma excitation source 232 is of a helicon type which may include a magnetic coil, an antenna, and a gas inlet for introduction of the gas into vacuum chamber 230 in which the plasma is to be excited. RF power may be provided from an RF power supply for example, at 13.56 megahertz (MHz), through a matching network to the antenna. Other types of plasma reactor may be utilized with other types of plasma excitation, including capacitively and inductively coupled excitation, electron cyclotron resonance excitation, etc.

Figure 4:
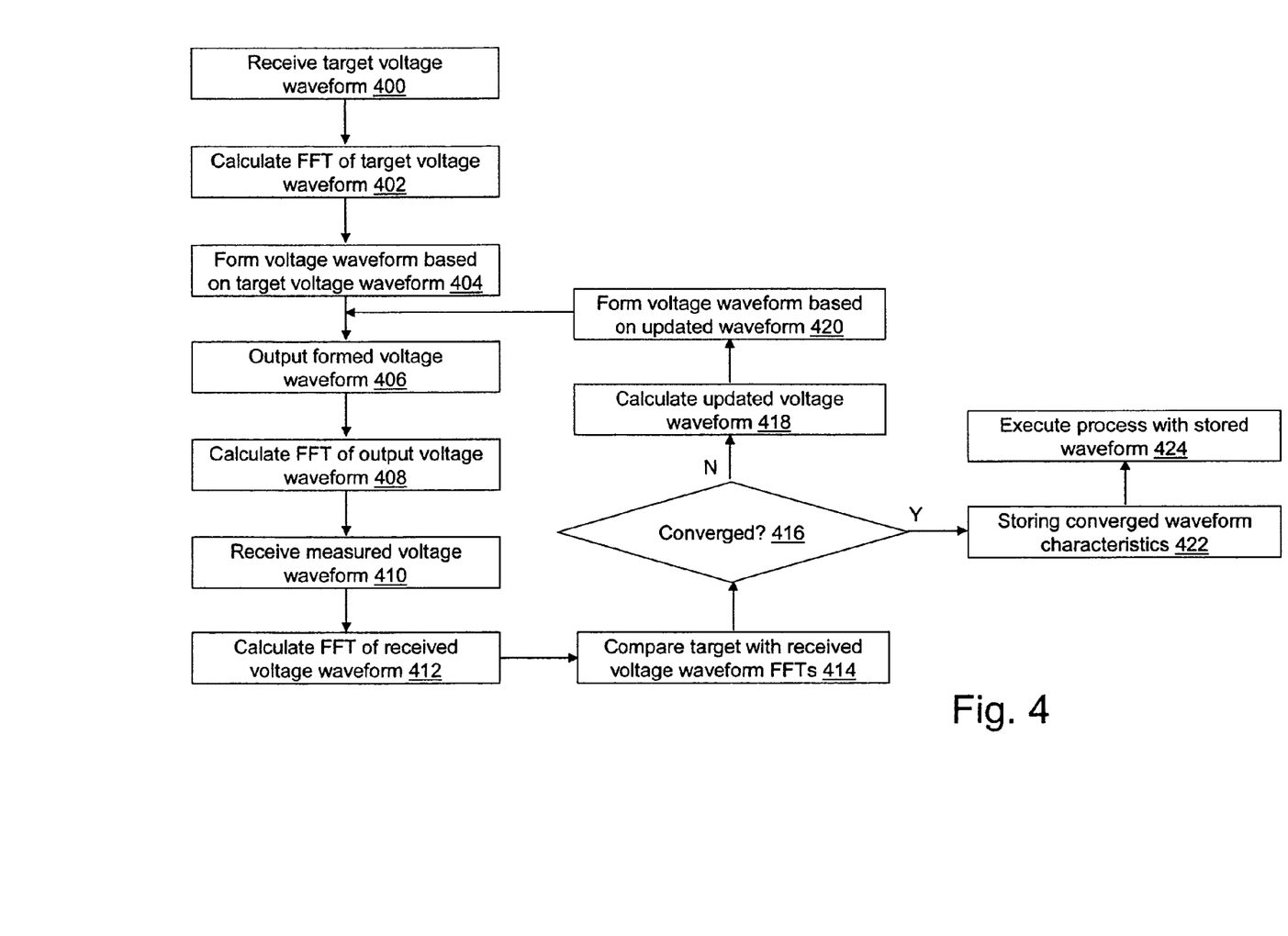
FIG. 4 depicts a flow diagram illustrating exemplary operations performed to automate the process of setting a target voltage waveform as an output of the signal generator of FIG. 2 in accordance with an exemplary embodiment.

With reference to FIG. 4, exemplary operations associated with automating the process of setting a target voltage waveform at support platform 226 are provided. Additional, fewer, or different operations may be performed, depending on the embodiment. The order of presentation of the operations is not intended to be limiting. The operations, for example, may be implemented in target waveform convergence application 308. In an operation 400, a target voltage waveform, $V_t(t)$, is received. For example, $V_t(t)$ may be selected by a user of computing device 206. A variety of mechanisms may be used to allow a user to select or to identify $V_t(t)$ at computing device 206, for example, using input interface 302 and/or display 300. The user may be able to select a waveform graphically, specify an equation describing the waveform, etc. Target waveform convergence application 308 receives the selection by the user.

Figure 5:
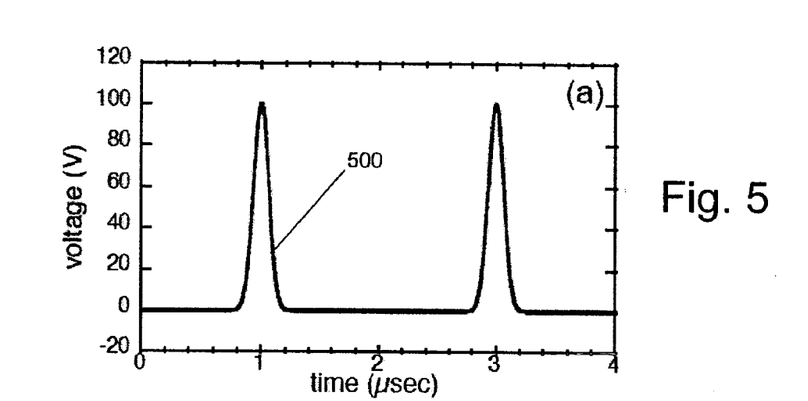
FIG. 5 is a graph of a first exemplary target voltage waveform.

With reference to FIG. 5, a target voltage waveform 500 is shown in accordance with an exemplary embodiment. Target voltage waveform 500 is structured to produce a narrow distribution of ion energies at substrate 228. Target voltage waveform 500 includes periodic spikes of voltage that allow a burst of electron flow to substrate 228 to neutralize the accumulated positive ion charge. The height of each spike sets the bombardment energy of the ions reaching the substrate. This shape can be generated by raising a sinusoid to a large power. The larger the exponent, the narrower the spike relative to the waveform period. Target voltage waveform 500 is specified analytically using the function: $V_t(t) = V_o \sin^m(\pi f_o t)$, where $V_o$ is the desired height of the spike and $f_o$ is the fundamental frequency of the repeated electrode waveform. In an exemplary embodiment, $f_o = 500$ kHz, and the value of m ranges from 100 to 200. Target voltage waveform 500 is essentially zero, except for a narrow spike midway through the period. A phase offset may be introduced to change the relative position of the spike. For target voltage waveform 500, $V_o = 100$ V and m=100, and the spike repeats with a 2 microsecond (µsec) period.

Figure 6:
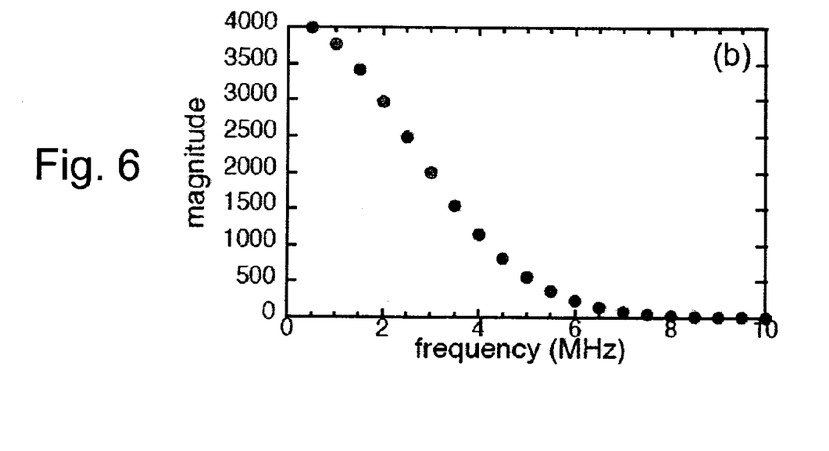
FIG. 6 is a graph of the magnitude of the first 10 harmonics of the first exemplary target voltage waveform of FIG. 5.

In an operation 402, an FFT of $V_t(t)$ is calculated. The calculated FFT of $V_t(t)$ may be stored in memory 304. Each cycle may be constructed from 512 points, so that there are 256 distinct harmonics. With reference to FIG. 6, the magnitude of the first 20 harmonics are displayed. By the 10th harmonic, the magnitude has dropped by a factor of 10 relative to the fundamental frequency. Above the 15th harmonic, the magnitudes are down by a factor of 100 or more. The narrower the spike in the electrode waveform (i.e., the larger the value of m), the greater the contribution of the higher harmonics may be.

In an operation 404, a voltage waveform $V_{in}(t)$ is formed based on $V_t(t)$ at computing device 206. For example, an initial estimate for $V_{in}(t)$ may have the same shape as $V_t(t)$. In an operation 406, $V_{in}(t)$ is output on first line 214 to waveform generator 208. For example, $V_{in}(t)$ may be downloaded to waveform generator 208. In an operation 408, an FFT of $V_{in}(t)$ is calculated. The calculated FFT of $V_{in}(t)$ may be stored in memory 304.

Waveform generator 208 is a programmable voltage waveform generator. In an exemplary embodiment, waveform generator 208 is an Agilent 33250 (output to 80 MHz), which accepts a digital input signal from computing device 206 on first line 214 to control its output signal on second line 216. The output signal from waveform generator 208 is input to power amplifier 210. In an exemplary embodiment, power amplifier 210 is an ENI Model No. A1000 rated for 1000 watts in the frequency range from 300 kilohertz (kHz)-35 MHz. In an exemplary embodiment, blocking capacitor 212 has a capacitance of 3.42 nanofarad (nF). The resulting electrode voltage, $V_{out}(t)$, is measured in the presence of plasma in vacuum chamber 230.

In an operation 410, the resulting electrode voltage, $V_{out}(t)$, is received at computing device 206 through fifth line 222. In an operation 412, an FFT of $V_{out}(t)$ is calculated. The calculated FFT of $V_{out}(t)$ may be stored in memory 304. In an operation 414, a plurality of frequency components of $V_{out}(t)$ are compared to the target voltage $V_t(t)$ at that frequency. Selection of the plurality of frequency components may be based on an amplitude contribution to the waveform at that frequency or may include all of the frequency components of the waveform. In an operation 416, a determination is made concerning whether or not $V_{out}(t)$ has converged to $V_t(t)$. A variety of methods may be used to determine convergence between two signals. In an exemplary embodiment, the user may select parameters associated with the convergence determination such as a maximum number of iterations, a convergence distance in phase, a convergence distance in amplitude, etc.

If $V_{out}(t)$ has not converged to $V_t(t)$, processing continues at an operation 418. If $V_{out}(t)$ has converged to $V_t(t)$, processing continues at an operation 422. In an exemplary embodiment, processing may stop after a predetermined number of iterations of the loop of 406-416 to ensure that an infinite loop does not result if $V_{out}(t)$ is not converging to $V_t(t)$. In an operation 422, the converged waveform characteristics are stored, for example, in memory 304. In operation 424, a process is executed with the stored converged waveform. In an exemplary embodiment, the process is a plasma etching process.

In an operation 418, each frequency component of $V_{in}(t)$ is individually updated to bring the electrode voltage closer to the target voltage $V_t(t)$ at that frequency. The voltages in the frequency domain are complex quantities. As a result, the relative phase, as well as the amplitude, of each harmonic is important in constructing the waveform shape. The updated components can be calculated using a variety of techniques to provide a rapid convergence to the target waveform. The mechanisms may be user selectable to allow a user to determine an optimum convergence algorithm based on the selected target waveform. In an operation 420, a new voltage waveform $V_{in}(t)$ is formed using an inverse FFT process to transform the updated frequency components to the time domain. Processing continues at operation 406.

In a first exemplary embodiment, updated frequency components $V_{in}^{(n+1)}(f)$ are determined linearly based on the current iteration n as:

$$V_{in}^{(n+1)}(f) = V_{in}^n(f) \frac{V_t(f)}{V_{out}^{in}(f)} \quad (1)$$

In the absence of a plasma, equation (1) yields a result very close to the target waveform at the electrode in a single iteration. However, in the presence of the plasma, the electrode waveform may fail to converge to the target shape even after a large number of iterations using the linear update. Nonlinearities associated with the presence of the plasma, thus may necessitate a different feedback method. A more gradual or "damped" approach to convergence with each iteration may be used such as, an "under-relaxed" Newton's method.

In a second exemplary embodiment, updated frequency components $V_{in}^{(n+1)}(f)$ are determined based on the current iteration n as:

$$V_n^{(n+1)}(f) = 0.5 * V_{in}^n(f)\left(1 + \frac{V_t(f)}{V_{out}^n(f)}\right) \quad (2)$$

In a third exemplary embodiment, updated frequency components $V_{in}^{(n+1)}(f)$ are determined based on the current iteration n as:

$$V_{in}^{(n+1)}(f) = V_{in}^n(f)\left(\frac{V_t(f)}{V_{out}^n(f)}\right)^{1/2} \quad (3)$$

Figure 7:
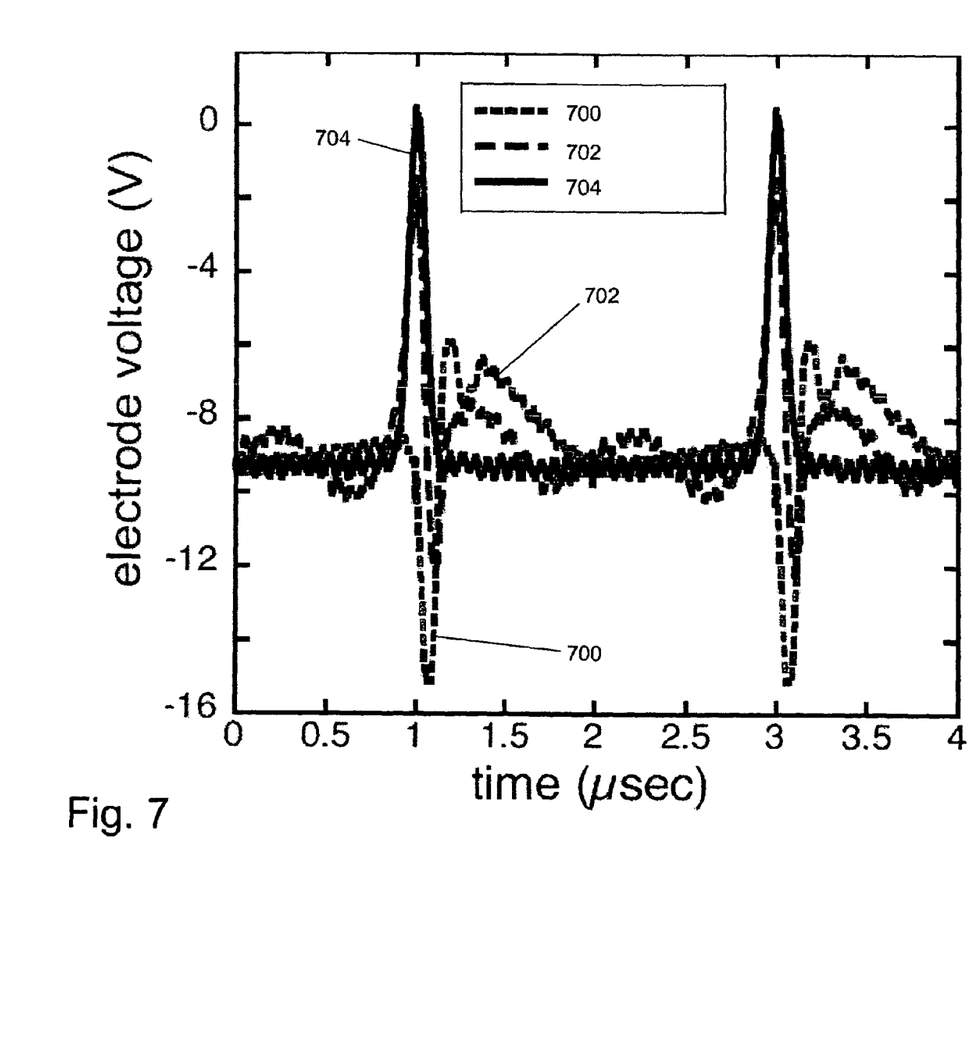
FIG. 7 is a graph comparing the electrode waveform generated after a sequence of iterations using a feedback process.

An example sequence of waveforms generated on three different iterations using equation 3 as a feedback method and an argon helicon plasma reactor (10 milliTorr (mTorr), 500 watts (W)) is presented with reference to FIG. 7. The target wave form is similar to that shown in FIG. 5, except $V_o=10$ V and m=200. The first iteration $V_{out}^1(f)$ 700 produced a negative spike rather than a positive one. The third iteration $V_{out}^3(f)$ 702 produced a positive spike. The ninth iteration $V_{out}^9(f)$ 704 produced a converged waveform, which matches the target waveform very well with the exception of low-amplitude, high frequency noise.

Figure 8:
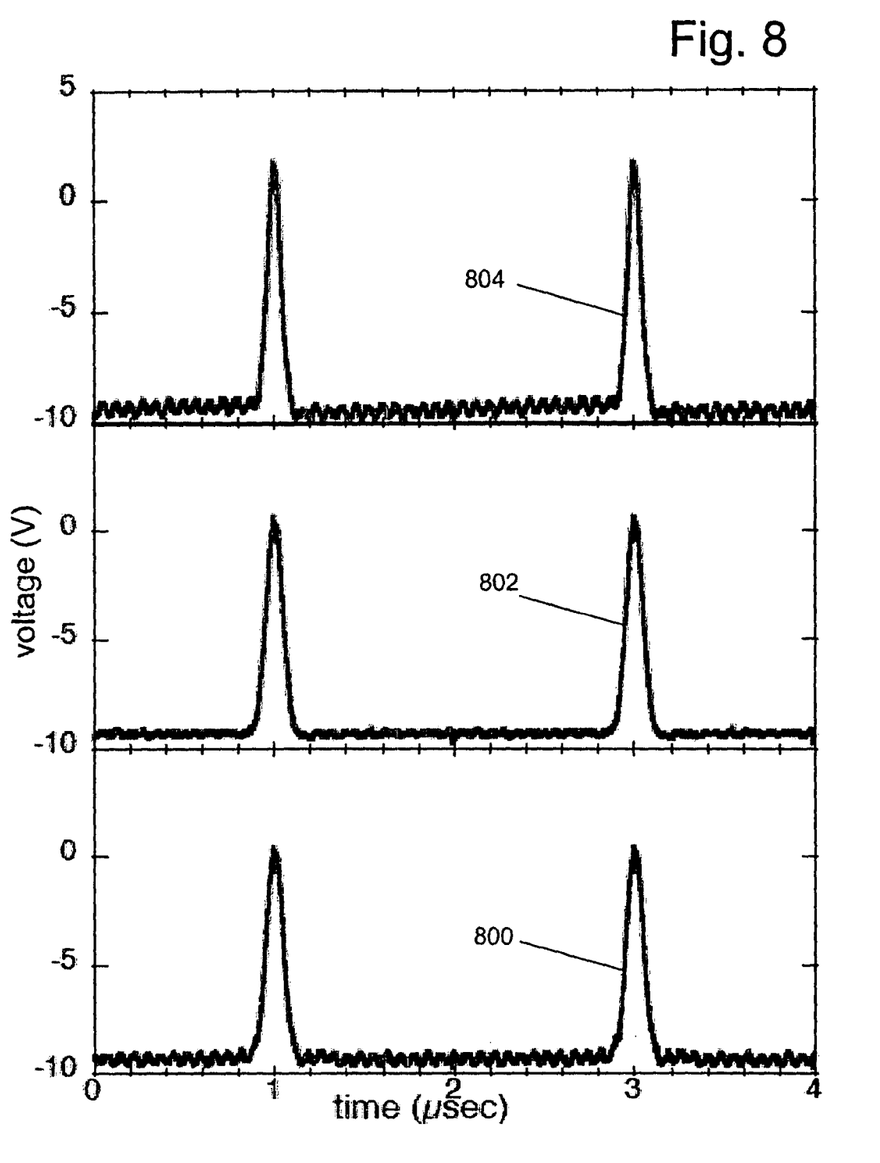
FIG. 8 is a first graph comparing the electrode waveform generated after a set of iterations using different feedback processes.
Figure 9:
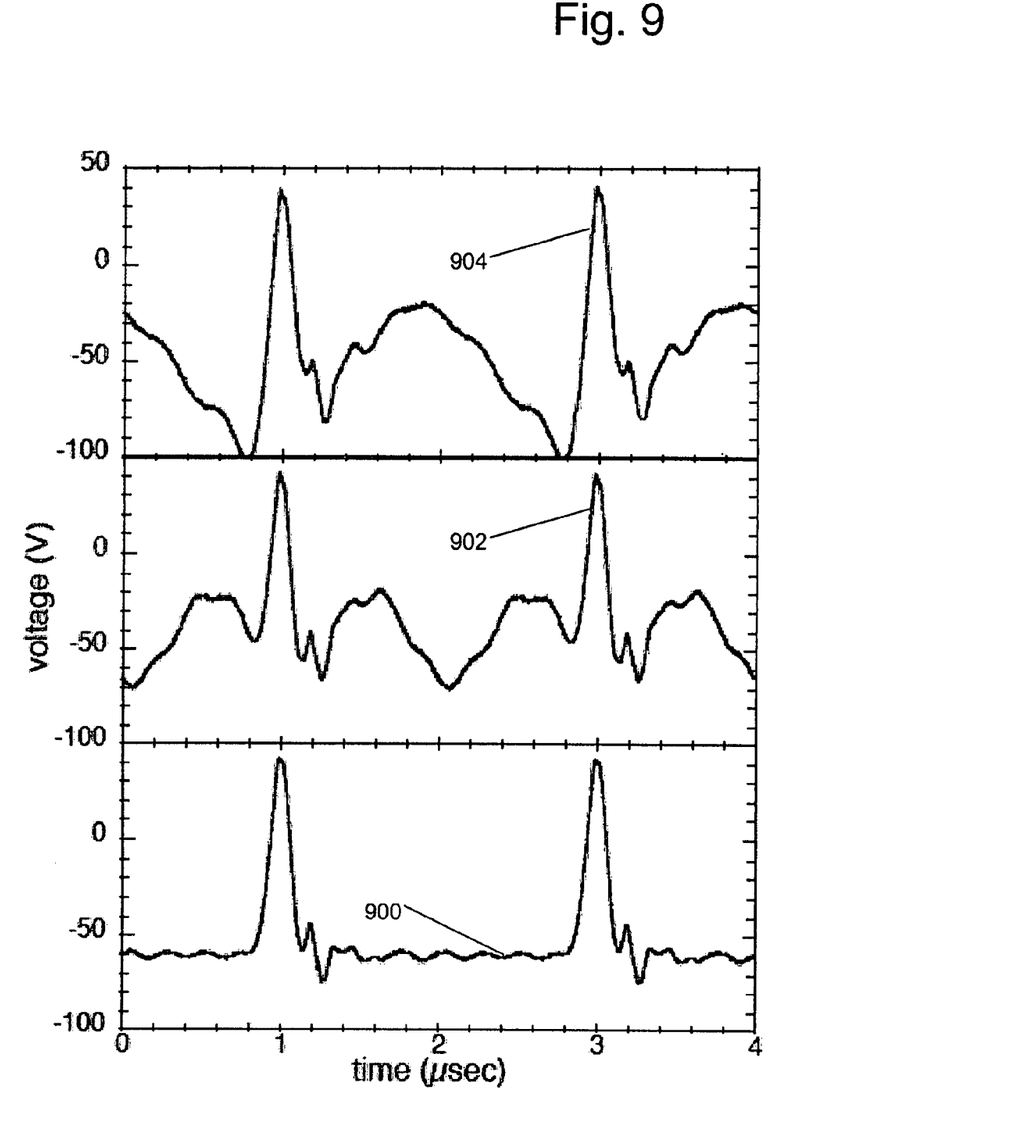
FIG. 9 is a second graph comparing the electrode waveform generated after a set of iterations using different feedback processes.

With reference to FIG. 8, a comparison between feedback methods using equation (1) (curve 800), equation (2) (curve 802), and equation (3) (curve 804) after 9-10 iterations is shown using an argon helicon plasma reactor with a target waveform of 10 V. All three approaches were effective in producing the target waveform in 9-10 iterations. With reference to FIG. 9, a comparison between feedback using equation (1) (curve 900), equation (2) (curve 902), and equation (3) (curve 904) after 19, 19, and 11 iterations, respectively with a target waveform of 100 V. Only the feedback method using equation (2) produced adequate results after eleven iterations. Neither of the other feedback methods resulted in a converged waveform even after an additional eight iterations or a total of 19 iterations.

In an exemplary embodiment, a user of target waveform convergence application 308 may be able to monitor progress of the convergence for each iteration on display 300. Additionally, the user of target waveform convergence application 308 may be able to select a feedback method using a variety of equations and may be able to specify or select convergence parameters. The user of target waveform convergence application 308 may further select a frequency range or set of harmonic frequencies on which the feedback method is applied.

Figure 10:
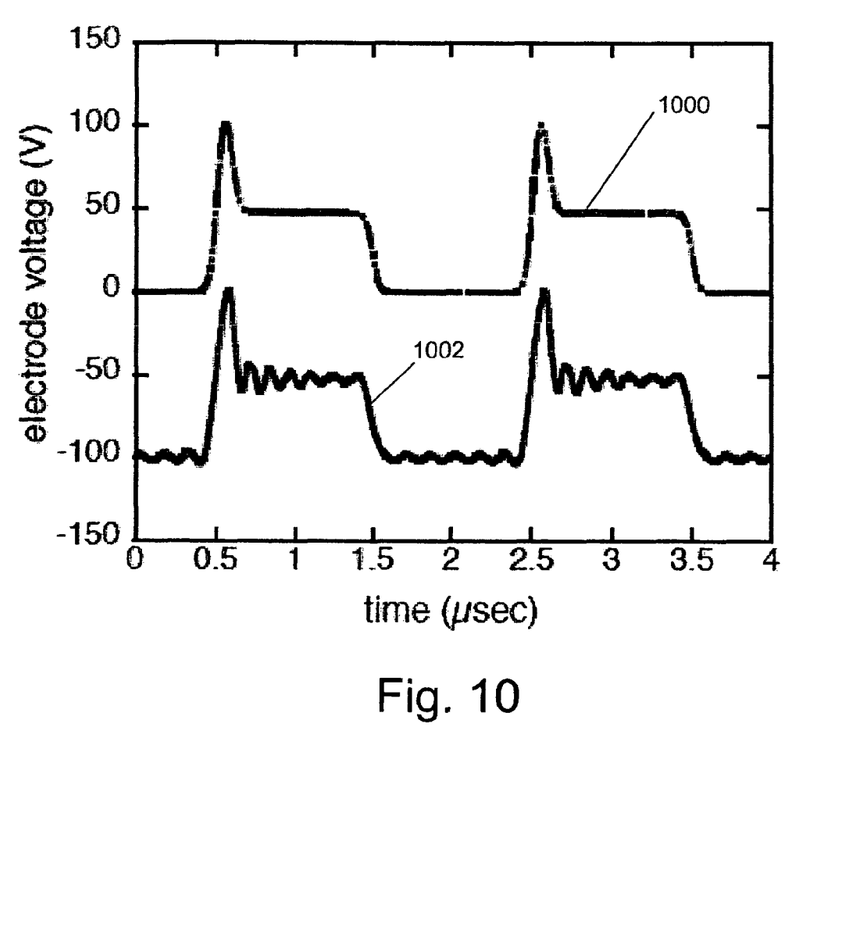
FIG. 10 is a graph of a second exemplary target voltage waveform and the electrode waveform generated after a set of iterations using an exemplary feedback process.

For some applications, it may be desirable to have an IED including two narrow peaks with independent control over the energy and relative ion flux in the two peaks. For example, in the etching of high aspect ratio trenches, low energy ions entering the trenches may be easily deflected to neutralize negative charge on the trench sidewalls due to incident plasma electrons, while higher energy ions are less easily deflected and reach the trench bottom to enhance etching there. With reference to FIG. 10, a "two level" target waveform 1000 to produce an IED with two narrow peaks is provided in accordance with an exemplary embodiment. The feedback method of equation (2) was used to generate an output waveform 1002. Target waveform 1000 includes a spike and two flat periods of constant voltage at two different voltage levels. The voltage levels of the flat periods relative to that at the peak of the spike set the energy levels of the two groups of ions, while the relative duration of the two flat periods sets the relative fluxes of the two groups of ions. The steps up and down are constructed with two Dirac delta functions, and the spike is constructed using a sine wave raised to the power m, as before. One cycle of the target waveform 1000 can be produced with the following relation evaluated from t=0 to t=2 μsec:

$$V_t(t) = V_0\left(\frac{1}{e^{(t_1-t)/0.01}+1} + \frac{1}{e^{(t-t_2)/0.01}+1} - 1\right) + V_1\sin^m(\pi f_0(t+t_1)) \quad (3)$$

where $V_0=50$ V, $f_0=500$ kHz, $t_1=0.5$ μsec, $t_2=1.5$ picoseconds, and m=200. The value of $V_1$ can be adjusted to achieve the desired peak height. In the example shown with reference to FIG. 10, a value of $V_1=62$ V produced a peak voltage of 100V close to time $t=t_1$.

The development of a systematic approach for waveform creation greatly improves the applicability of waveform control since it can in principle be applied to any system, and any plasma condition, and because it makes customization of the ion energy distribution at the electrode readily achievable. Furthermore, control over the waveform shape facilitates investigation of the effect of ion energy on etching, as well as factors ultimately limiting control of the energy distribution of ions bombarding the substrate. The ability to control a voltage waveform applied to an object may have application in a variety of systems and is not limited to the plasma etching process described as an exemplary application.

The word "exemplary" is used herein to mean serving as an example, instance, or illustration. Any aspect or design described herein as "exemplary" is not necessarily to be construed as preferred or advantageous over other aspects or designs.

The exemplary embodiments may be implemented as a method, apparatus, or article of manufacture using standard programming and/or engineering techniques to produce software, firmware, hardware, or any combination thereof to control a computer to implement the disclosed embodiments. The term "computer readable medium" can include, but is not limited to, magnetic storage devices (e.g., hard disk, floppy disk, magnetic strips, . . . ), optical disks (e.g., compact disk (CD), digital versatile disk (DVD), . . . ), smart cards, flash memory devices, etc. Additionally, it should be appreciated that a carrier wave can be employed to carry computer-readable media such as those used in transmitting and receiving electronic mail or in accessing a network such as the Internet or a local area network (LAN). The network access may be wired or wireless.

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The functionality described may be implemented in a single executable or application or may be distributed among modules that differ in number and distribution of functionality from those described herein. Additionally, the order of execution of the functions may be changed depending on the embodiment. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A device for setting a voltage waveform at a platform supporting a substrate for etching using a plasma etching process, the device comprising:
    a waveform generator;
    a processor; and
    a computer-readable medium operably coupled to the processor, the computer-readable medium comprising instructions that, upon execution by the processor, perform operations which cause the device to
    (a) receive a first waveform for applying to an object;
    (b) calculate a first fast Fourier transform (FFT) of the received first waveform;
    (c) determine a second waveform for input to the waveform generator based on the received first waveform;
    (d) send the determined second waveform to the waveform generator;
    (e) generate a third waveform from the waveform generator for application to the object;
    (f) receive a fourth waveform measured across the object based on the generated third waveform;
    (g) calculate a second FFT of the received fourth waveform;
    (h) compare the received fourth waveform with the received first waveform to determine a convergence status of the received fourth waveform;
    (i) if the determined convergence status is not converged, calculate an updated waveform based on the calculated first FFT and the calculated second FFT and repeat (d)-(h) with the updated waveform as the determined second waveform; and
    (j) if the determined convergence status is converged, store the determined second waveform.

2. The device of claim 1, wherein the object is a substrate enclosed in a plasma reactor with a plasma forming gas and wherein the instructions further perform an operation which causes the device to execute a plasma etching process on the substrate using the stored waveform.

3. The device of claim 1, wherein the measured waveform is a bias voltage applied to the object through a DC blocking capacitor.

4. The device of claim 1, wherein the first waveform is selected to produce an ion energy distribution that provides a desired etch selectivity for the substrate.

5. The device of claim 1, wherein comparing the received fourth waveform with the received first waveform comprises comparing the calculated first FFT with the calculated second FFT.

6. The device of claim 1, wherein the instructions further perform an operation which causes the device to calculate a third FFT of the determined second waveform, wherein calculating the updated waveform is further based on the calculated third FFT.

7. The device of claim 6, wherein calculating the updated waveform is based on solving the equation $$V_{in}^n(f)\left(\frac{V_t(f)}{V_{out}^n(f)}\right)^{1/2},$$

where $V_t(f)$ is the calculated first FFT, $V_{in}^n(f)$ is the calculated third FFT, and $V_{out}^n(f)$ is the calculated second FFT.

8. The device of claim 1, wherein calculating the updated waveform includes an amplitude of the calculated first FFT at a plurality of frequencies and an amplitude of the calculated second FFT at a corresponding plurality of frequencies.

9. The device of claim 8, wherein calculating the updated waveform further includes a phase of the calculated first FFT at the plurality of frequencies and a phase of the calculated second FFT at the corresponding plurality of frequencies.

10. The device of claim 1, wherein calculating the updated waveform is based on a damped ratio of the calculated first FFT at a plurality of frequencies and of the calculated second FFT at a corresponding plurality of frequencies.

11. The device of claim 1, wherein calculating the updated waveform comprises calculating an inverse FFT of the updated waveform based on the calculated first FFT and on the calculated second FFT.

12. The device of claim 1, wherein (i) further comprises repeating (d)-(h) with the updated waveform as the determined second waveform until the determined convergence status is converged.

13. A system for performing a plasma etching process, the system comprising:
    a plasma reactor, the plasma reactor comprising
        a platform for supporting a substrate to be etched;
        a chamber enclosing the platform; and
        a plasma excitation source coupled to the chamber for exciting a plasma and forming a gas in the chamber; and
    a signal generator; the signal generator comprising
        a waveform generator;
        a processor; and
        a computer-readable medium operably coupled to the processor, the computer-readable medium comprising instructions that, upon execution by the processor, perform operations which cause the device to
        (a) receive a first waveform for applying to the substrate;
        (b) calculate a first fast Fourier transform (FFT) of the received first waveform;
        (c) determine a second waveform for input to the waveform generator based on the received first waveform;
        (d) send the determined second waveform to the waveform generator;
        (e) generate a third waveform from the waveform generator for application to the substrate;
        (f) receive a fourth waveform measured across the object based on the generated third waveform;
        (g) calculate a second FFT of the received fourth waveform;
        (h) compare the received fourth waveform with the received first waveform to determine a convergence status of the received fourth waveform;

(i) if the determined convergence status is not converged, calculate an updated waveform based on the calculated first FFT and the calculated second FFT and repeat (d)-(h) with the updated waveform as the determined second waveform; and (j) if the determined convergence status is converged, store the determined second waveform.

14. A computer-readable medium including computer-readable instructions that, upon execution by a processor, cause the processor to automate a process for controlling a voltage waveform applied to an object, the instructions configured to cause a computing device to:

(a) receive a first waveform for applying to an object;

(b) calculate a first fast Fourier transform (FFT) of the received first waveform;

(c) determine a second waveform for input to a waveform generator based on the received first waveform;

(d) send the determined second waveform to the waveform generator;

(e) receive a third waveform measured across the object based on a waveform generated by the waveform generator;

(f) calculate a second FFT of the received third waveform;

(g) compare the received third waveform with the received first waveform to determine a convergence status of the received third waveform;

(h) if the determined convergence status is not converged, calculate an updated waveform based on the calculated first FFT and the calculated second FFT and repeat (d)-(g) with the updated waveform as the determined waveform; and (i) if the determined convergence status is converged, store the determined waveform.

15. The computer-readable medium of claim 14, wherein the object is a substrate enclosed in a plasma reactor with a plasma forming gas.

16. A method of automating a process for controlling a voltage waveform applied to an object, the method comprising:

(a) receiving a first waveform for applying to an object;

(b) calculating a first fast Fourier transform (FFT) of the received first waveform;

(c) determining a second waveform for input to a waveform generator based on the received first waveform;

(d) sending the determined second waveform to the waveform generator;

(e) receiving a third waveform measured across the object based on a waveform generated by the waveform generator;

(f) calculating a second FFT of the received third waveform;

(g) comparing the received third waveform with the received first waveform to determine a convergence status of the received third waveform;

(h) if the determined convergence status is not converged, calculating an updated waveform based on the calculated first FFT and the calculated second FFT and repeating (d)-(g) with the updated waveform as the determined waveform; and (i) if the determined convergence status is converged, storing the determined waveform.

17. The method of claim 16, wherein the third waveform is a bias voltage applied to the object through a capacitor.

18. The method of claim 16, wherein the object is a substrate enclosed in a plasma reactor with a plasma forming gas.

19. The method of claim 18, wherein the received first waveform is selected to produce an ion energy distribution that provides a desired etch selectivity for the substrate.

20. The method of claim 16, further comprising calculating a third FFT of the determined second waveform, wherein calculating the updated waveform is further based on the calculated third FFT.

21. The method of claim 20, wherein calculating the updated waveform is based on solving the equation $$V_{in}^n(f)\left(\frac{V_t(f)}{V_{out}^n(f)}\right)^{1/2},$$

where $V_t(f)$ is the calculated first FFT, $V_{in}^n(f)$ is the calculated third FFT, and $V_{out}^n(f)$ is the calculated second FFT.

22. The method of claim 16, wherein calculating the updated waveform is based on a damped ratio of the calculated first FFT at a plurality of frequencies and of the calculated second FFT at a corresponding plurality of frequencies.

23. The method of claim 16, wherein calculating the updated waveform comprises calculating an inverse FFT of the updated waveform based on the calculated first FFT and the calculated second FFT.

* * * * *